（12) United States Patent
Park et al.

(10) Patent No.: US 10,439,079 B2
(45) Date of Patent: Oct. 8, 2019

(54) METHOD OF MANUFACTURING A FINGER ELECTRODE FOR A SOLAR CELL

(71) Applicant: SAMSUNG SDI CO., LTD., Yongin-si, Gyeonggi-do (KR)

(72) Inventors: Sang Hee Park, Suwon-si (KR); Sang Jin Kim, Suwon-si (KR); Jae Hwi Cho, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 34 days.

(21) Appl. No.: 15/628,993

(22) Filed: Jun. 21, 2017

(65) Prior Publication Data

US 2018/0158969 A1  Jun. 7, 2018

(30) Foreign Application Priority Data

Dec. 2, 2016  (KR) .................. 10-2016-0163886

(51) Int. Cl.
*H01L 31/044* (2014.01)
*H01L 31/0224* (2006.01)
*H01B 1/22* (2006.01)

(52) U.S. Cl.
CPC ....... *H01L 31/022425* (2013.01); *H01B 1/22* (2013.01); *H01L 31/022433* (2013.01); *Y02E 10/50* (2013.01)

(58) Field of Classification Search
CPC ..... H01L 31/00–31/078; H01L 31/18–31/208; Y02E 10/50–10/60
USPC ............................... 136/243–265; 438/57–98
See application file for complete search history.

(56) References Cited

U.S. PATENT DOCUMENTS

| 2013/0316492 A1* | 11/2013 | Ushifusa ............. B41F 15/40 438/98 |
| 2014/0024165 A1 | 1/2014 | Masunaga et al. |
| 2015/0333197 A1* | 11/2015 | Takeda ................ H01B 1/22 136/256 |

FOREIGN PATENT DOCUMENTS

| CN | 202782135 | * | 3/2013 |
| CN | 103140932 | A | 6/2013 |
| JP | 2007-294504 | * | 8/2007 |
| JP | 4255248 | B2 | 2/2009 |
| JP | 20140000740 | * | 1/2014 |
| KR | 2014/0127947 | A | 11/2014 |
| WO | WO 2015/104793 | A1 | 7/2015 |

OTHER PUBLICATIONS

JP2007-294504 English Translation (Year: 2007).*
Taiwanese Office Action dated Apr. 20, 2018 in the corresponding Taiwanese Patent Application No. 106121690.
Korean Office Action dated Nov. 19, 2018.

* cited by examiner

*Primary Examiner* — Bach T Dinh
(74) *Attorney, Agent, or Firm* — Lee & Morse, P.C.

(57) ABSTRACT

A method of manufacturing a finger electrode for a solar cell including printing a conductive paste on one surface of a substrate using a print mask having an aperture ratio of about 65% or more, and baking the printed conductive paste. The conductive paste includes a conductive powder, a glass frit, and an organic vehicle. The organic vehicle includes a solvent having a vapor pressure of about 0.1 Pa to about 500 Pa at room temperature and a flash point of about 90° C. to about 150° C.

7 Claims, 1 Drawing Sheet longitudinal direction longitudinal direction

METHOD OF MANUFACTURING A FINGER ELECTRODE FOR A SOLAR CELL

CROSS-REFERENCE TO RELATED APPLICATION

Korean Patent Application No. 10-2016-0163886, filed on Dec. 2, 2016 in the Korean Intellectual Property Office, and entitled: "Method of Manufacturing a Finger Electrode for a Solar Cell," is incorporated by reference herein in its entirety.

BACKGROUND

1. Field

Embodiments relate to a method of manufacturing a finger electrode for a solar cell.

2. Description of Related Art

Solar cells generate electricity using the photovoltaic effect of a p-n junction, which converts photons of sunlight into electricity. In the solar cell, front and rear electrodes are formed on respective upper and lower surfaces of a semiconductor wafer or substrate having the p-n junctions. The photovoltaic effect at the p-n junction is induced by sunlight entering the semiconductor wafer. Electrons generated by the photovoltaic effect at the p-n junction provide electric current to the outside through the electrodes.

An electrode of the solar cell may be formed on the semiconductor substrate by disposing a print mask having an opening corresponding to where the electrode will be formed, followed by disposing a conductive paste on the print mask, printing the conductive paste onto the semiconductor substrate through the opening of the print mask in the shape of the electrode, and baking the conductive paste.

SUMMARY

Embodiments are directed to a method of manufacturing a finger electrode for a solar cell including printing a conductive paste on one surface of a substrate using a print mask having an aperture ratio of about 65% or more, and baking the printed conductive paste. The conductive paste includes a conductive powder, a glass frit, and an organic vehicle. The organic vehicle includes a solvent having a vapor pressure of about 0.1 Pa to about 500 Pa at room temperature and a flash point of about 90° C. to about 150° C.

The print mask may have an aperture ratio of about 65% to about 90%.

The print mask may include a mesh, a photosensitive resin layer integrated with the mesh, and an electrode printing portion on which a photosensitive resin layer is removed.

The mesh may include warp threads and weft threads. An angle of the warp threads of the mesh with respect to a longitudinal direction of the print mask may be 80° to 100°.

An interval of weft threads located on upper and lower portions of the electrode printing portion is wider than the interval of weft threads located at other areas of the mesh.

The baking may be performed at a temperature of about 700° C. to about 1,000° C.

The solvent may include at least one selected from dipropylene glycol n-propyl ether, dipropylene glycol n-butyl ether, tripropylene glycol methyl ether, tripropylene glycol n-butyl ether, propylene glycol phenyl ether, dipropylene glycol phenyl ether, diethylene glycol methyl ether, triethylene glycol methyl ether, diethylene glycol ethyl ether, triethylene glycol ethyl ether, diethylene glycol n-butyl ether, triethylene glycol n-butyl ether, diethylene glycol n-butyl ether acetate, 2,2,4-trimethyl-1,3-pentanediol monoisobutyrate, ethylene glycol hexyl ether, diethylene glycol hexyl ether, ethylene glycol phenyl ether, diethylene glycol phenyl ether, trimethylnonanol, and diethylene glycol dibutyl ether.

The conductive paste may include about 60 wt % to about 95 wt % of the conductive particles, about 0.5 wt % to about 20 wt % of the glass fit, and about 1 wt % to about 30 wt % of the organic vehicle.

The conductive paste may further include at least one additive selected from a dispersing agent, a thixotropic agent, a plasticizer, a viscosity stabilizer, an antifoaming agent, a pigment, an ultraviolet stabilizer, an antioxidant, and a coupling agent.

A finger electrode for a solar cell manufactured by the method described herein.

The finger electrode may satisfy the following Formula 1:

$$0.4 \leq A \leq 0.6 \quad \text{[Formula 1]}$$

wherein, A is an aspect ratio represented by the following formula: thickness of the finger electrode/width of the finger electrode.

BRIEF DESCRIPTION OF THE DRAWING

Features will become apparent to those of skill in the art by describing in detail exemplary embodiments with reference to the attached drawings in which.

DETAILED DESCRIPTION

Figure 1:
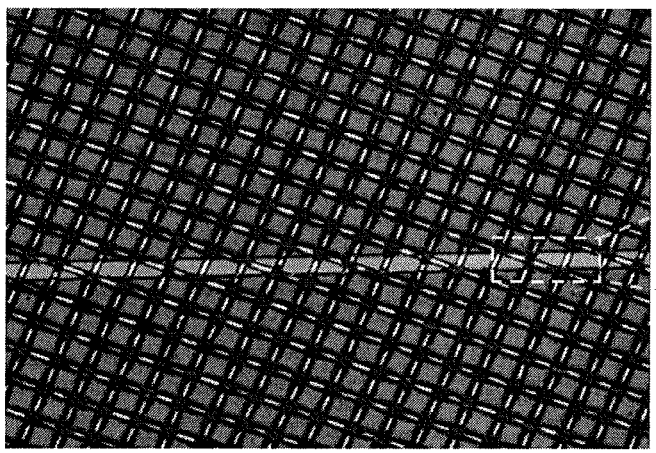
FIG. 1 illustrates a view depicting a print mask generally used for a finger electrode of a solar cell.
Figure 1:
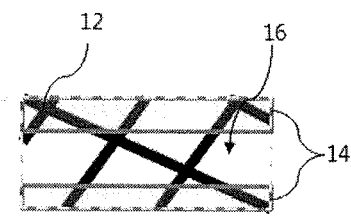

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration.

Method of Manufacturing a Finger Electrode for a Solar Cell

In an implementation, a method of manufacturing a finger electrode for a solar cell may include printing a conductive paste on one surface of a substrate using a print mask having an aperture ratio of about 65% or more; and baking the printed conductive paste. As used herein, the term "aperture ratio" refers to the percentage of a non-mesh area of the electrode printing portion with regard to a total area of the electrode printing portion.

Figure 2:
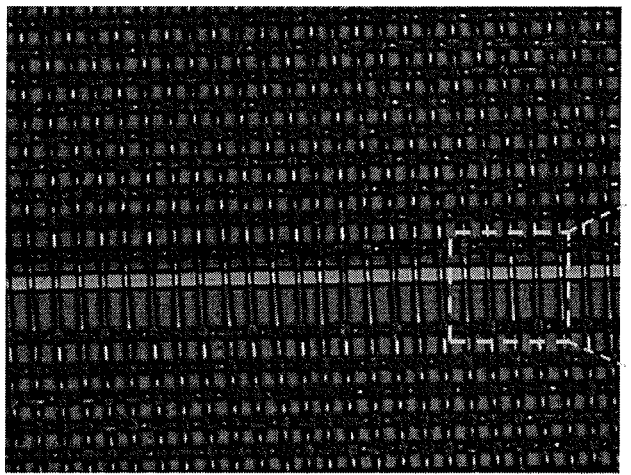
FIG. 2 illustrates a view depicting a print mask having a high aperture ratio according to an embodiment.
Figure 2:
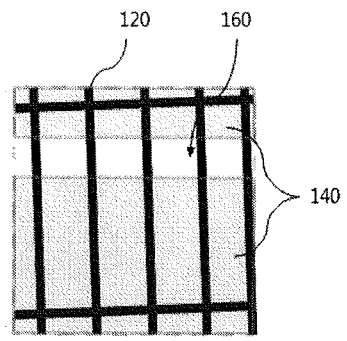

In FIG. 2, a print mask 100 according to an embodiment is illustrated. As shown in FIG. 2, the print mask 100 includes a mesh 120, a photosensitive resin layer 140 integrated with the mesh 120, and an electrode printing portion 160 in which the photosensitive resin layer is absent. Such a print mask 100 may be formed, for example, by applying a photoresist resin 140 onto a mesh 120 aligned as shown, for example, in FIG. 2, followed by selectively removing a portion of the photosensitive resin to print an electrode through a photoresist process, thereby forming an electrode printing portion 160. The print mask 100 may have an aperture ratio of about 65% or more, or, for example, about 65% to about 90%. The aperture ratio is a value calculated from the following Equation 1:

Aperture ratio (%)=[(Area of electrode printing portion−Area of mesh in the electrode printing portion)/Area of electrode printing portion]×100 [Equation 1]

Within this range of the aperture ratio of the electrode printing portion 160, the amount of the conductive paste that may be printed per unit area may be increased and the aspect ratio of the finger electrode may be improved. By way of examples, the aperture ratio of the print mask 100 may be about 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, or 90%.

In the print mask 100 according an embodiment, an angle of a warp thread of the mesh 120 with respect to a longitudinal direction of the print mask 100 may be 80° to 105°, or, for example, 85° to 105°. Within this range, the area of the mesh 120 in the electrode printing portion 160 may be small to obtain a high aperture ratio.

By way of example, the angle of the warp thread of the mesh 120 with respect to a longitudinal direction of the print mask 100 may be 80°, 81°, 82°, 83°, 84°, 85°, 86°, 87°. 88°, 89°. 90°, 91°, 92°, 93°, 94°, 95°, 96°, 97°, 98°, 99°, 100°, 101°. 102°, 103°, 104° or 105°.

As shown in FIG. 2, in an implementation, the interval of the weft threads of the mesh 120 disposed on the upper and lower portions of the electrode printing portion 160 may be wider than the interval of the weft threads in other areas. By widening the intervals of the weft threads of the mesh 120 disposed near the electrode printing portion 160, the area of the mesh 120 occupying in the electrode printing portion 160 becomes smaller. Thus, deterioration of printability caused by tension added to the print mask 100 from a pressure during printing of the conductive paste may be reduced or prevented.

Next, a conductive paste according to an embodiment will be explained. In an implementation, the conductive paste may include a conductive power, a glass frit, and an organic vehicle.

(1) Conductive Powder

The conductive powder may include a suitable conductive powder used in solar cell electrodes. For example, the conductive powder may be or include silver, aluminum, nickel, copper, or combinations thereof. In an embodiment, silver powder may be used. The particle size of the conductive powder may be on a nanometer or micrometer scale. For example, the conductive powder may have a particle size of dozens to several hundred nanometers, or several to dozens of micrometers. In an embodiment, the Conductive powder may be a mixture of two or more types of conductive powders having different particle sizes.

The conductive powder may have a suitable shape such as, for example, a spherical, flake or amorphous shape.

The conductive powder may have an average particle diameter (D50) of about 0.1 μm to about 10 μm. For example, the conductive powder may have an average particle diameter of about 0.5 μm to about 5 μm. The average particle diameter may be measured using a Model 1064LD particle size analyzer (Cilas Co., Ltd.) after dispersing the conductive powder in isopropyl alcohol (IPA) at 25° C. for 3 minutes via ultrasonication. Within this range, the conductive powder may provide low contact resistance and low line resistance.

The conductive powder may be present in an amount of about 60 wt % to about 95 wt % based on a total weight of the composition of the conductive paste. Within this range, the conductive powder may exhibit good conversion efficiency in the solar cell and may easily become a paste. For example, the conductive powder may be present in an amount of about 70 wt % to about 90 wt % based on the total weight of the composition of the conductive paste. In an embodiment, the conductive powder may be present in an amount of about 60 wt %, 61 wt %, 62 wt %, 63 wt %, 64 wt %, 65 wt %, 66 wt %, 67 wt %, 68 wt %, 69 wt %, 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, 94 wt %, or 95 wt %, based on the total weight of the composition of the conductive paste.

(2) Glass Frit

The glass frit may serve to enhance adhesion between the conductive powder and a wafer and form silver crystal grains in an emitter region by etching an anti-reflection film and melting the conductive powder so as to reduce contact resistance during a baking process of the composition for solar cell electrodes. Further, during the baking process, the glass frit may soften and decrease the baking temperature.

When the sheet resistance of a solar cell is increased in order to improve the conversion efficiency of the solar cell, there is a possibility that the contact resistance and leak current of the solar cell may also increase. Thus, it may be desirable to minimize both serial resistance (Rs) and influence on the p-n junction and maximize the open circuit voltage (Voc). In addition, as a baking temperature varies within a broad range according to characteristics of wafers having different sheet resistances, it may be desirable that the glass frit secure sufficient thermal stability to withstand a wide range of baking temperatures.

In an implementation, the glass frit may include tellurium (Te), and at least one selected from bismuth (Bi) and lead (Pb).

By way of example, the glass frit may be or include a bismuth-tellurium-oxide(Bi—Te—O)-based glass frit. The Bi—Te—O-based glass frit may include about 1 mol % to about 30 mol % of bismuth and about 30 mol % to about 70 mol % of tellurium, and may include bismuth and tellurium in a mole ratio of about 1:0.1 to about 1:50.

By way of example, the glass frit may be or include a lead-bismuth-tellurium-oxide(Pb—Bi—Te—O)-based glass frit. The Pb—Bi—Te—O-based glass fit may include about 1 mol % to about 55 mol % of lead, about 1 mol % to about 30 mol % of bismuth and about 30 mol % to about 70 mol % of tellurium, and may include (lead and bismuth): (tellurium) in a mole ratio of about 1:0.1 to about 1:50.

In an implementation, the glass frit may further include metal and/or metal oxide other than bismuth (Bi), tellurium (Te) and lead (Pb). By way of example, the glass frit may further include at least one selected from lithium (Li), zinc (Zn), phosphorus (P), germanium (Ge), gallium (Ga), cerium (Ce), iron (Fe), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and oxides thereof.

The glass frits may be prepared from the metal oxides as set forth above by a suitable method. For example, the oxides may be mixed in a predetermined ratio. Mixing may be carried out using a ball mill or a planetary mill. The mixed composition may be melted at about 900° C. to about 1,300° C., followed by quenching to 25° C. The obtained resultant may be subjected to pulverization using, for example, a disk mill or a planetary mill to prepare a glass frit.

The glass frit may have an average particle diameter (D50) of about 0.1 μm to about 10 μm. The glass frit may have, for example, a spherical or amorphous shape.

The glass frit may be present in an amount of about 0.5 wt % to about 20 wt %, or, for example, about 0.5 wt % to about 3.5 wt %, based on a total weight of the composition of the conductive paste. Within this range, the glass frit may secure excellent p-n adhesion stability given varying surface resistances while minimizing serial resistance, and solar cell efficiency may be improved. In an embodiment, the glass frit may be present in an amount of about 0.5 wt %, 1 wt %, 1.5 wt %, 2 wt %, 2.5 wt %, 3 wt %, 3.5 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %, based on the total weight of the composition of the conductive paste.

(3) Organic Vehicle

The organic vehicle may impart suitable viscosity and rheological characteristics for printing to the composition of the conductive paste through mechanical mixing with the inorganic component of the conductive paste.

The organic vehicle may include a solvent and an organic binder.

In an implementation, the solvent may have a vapor pressure of about 0.1 Pa to about 500 Pa, or, for example, about 0.5 Pa to about 100 Pa, at room temperature, e.g., 20° C. to 23° C., and a flash point of about 90° C. to about 150° C., or, for example, about 90° C. to about 130° C. Use of a solvent having a vapor pressure of less than about 0.1 Pa could result in incomplete drying in a drying furnace, thereby resulting in a blurry printing error. Use of a solvent having a vapor pressure of more than about 500 Pa could cause an evaporation of the solvent during the printing process to increase the surface roughness of the finger electrode and increase the line resistance. Use of a solvent having a flash point of less than about 90° C. could result in drying of the conductive paste during the printing process, thereby resulting in broken lines at the crossing points of the mesh. Use of a solvent having a flash point of more than about 150° C. could result in insufficient drying of the solvent, thereby resulting in a blurry line width. In an embodiment, the solvent may have a vapor pressure of about 0.9 Pa to about 1.5 Pa at room temperature, e.g., 20° C. to 23° C., and a flash point of about 100° C. to about 110° C.

By way of example, the solvent may include at least one selected from dipropylene glycol n-propyl ether, dipropylene glycol n-butyl ether, tripropylene glycol methyl ether, tripropylene glycol n-butyl ether, propylene glycol phenyl ether, dipropylene glycol phenyl ether, diethylene glycol methyl ether, triethylene glycol methyl ether, diethylene glycol ethyl ether, triethylene glycol ethyl ether, diethylene glycol n-butyl ether, triethylene glycol n-butyl ether, diethylene glycol n-butyl ether acetate, 2,2,4-trimethyl-1,3-pentanediol monoisobutyrate, ethylene glycol hexyl ether, diethylene glycol hexyl ether, ethylene glycol phenyl ether, diethylene glycol phenyl ether, trimethylnonanol, and diethylene glycol dibutyl ether.

By way of example, the use of a solvent such as diethylene glycol n-butyl ether acetate, or 2,2,4-trimethyl-1,3-pentanediol monoisobutyrate may result in an excellent aspect ratio.

In an implementation, the organic binder may include an acrylate based resin or a cellulose based resin. By way of example, ethyl cellulose may be used. Ethyl hydroxyethyl cellulose, nitrocellulose, a mixture of ethyl cellulose and a phenol resin, an alkyd resin, a phenol based resin, an acrylic ester based resin, a xylene based resin, a polybutene based resin, a polyester based resin, a urea based resin, a melamine based resin, a vinyl acetate based resin, a wood rosin, polymethacrylate of alcohol, or the like may also be used.

In an implementation, the organic vehicle may be present in an amount of about 1 wt % to about 30 wt % based on a total weight of the composition of the conductive paste. Within this range, a sufficient adhesion strength and excellent printability may be secured. By way of example, the organic vehicle may be present in an amount of about 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt %, based on the total weight of the composition of the conductive paste.

(4) Additives

In an implementation, the conductive paste may further include a suitable additive, for example, to enhance fluidity, process properties, and stability. The additive may include, for example, a dispersing agent, a thixotropic agent, a plasticizer, a viscosity stabilizer, an anti-foaming agent, a pigment, an ultraviolet stabilizer, an antioxidant, a coupling agent, or the like. These additives may be used alone or as mixtures thereof. In an implementation, the additive may be present in an amount of about 0.1 wt to about 5 wt % based on a total weight of the composition of the conductive paste. The content of the additive may be varied, as desired. By way of example, the additive may be present in an amount of about 0.1 wt %, 0.2 wt %, 0.3 wt %, 0.4 wt %, 0.5 wt %, 0.6 wt %, 0.7 wt %, 0.8 wt %, 0.9 wt %, 1 wt %, 1.5 wt %, 2 wt %, 2.5 wt %, 3 wt %, 3.5 wt %, 4 wt %, 4.5 wt %, or 5 wt %, based on the total weight of the composition of the conductive paste.

In an implementation, the process of printing the conductive paste may be performed by disposing a print mask having an aperture ratio of 65% or more on one surface of a substrate, followed by disposing the conductive paste on the print mask, and moving a pressing device such as a squeezer or a roller onto the conductive paste to print the conductive paste onto the surface of the substrate through the opening of the print mask.

After printing the conductive paste, the conductive paste may be dried at about 150° C. to about 400° C., or, for example, at about 200° C. to about 350° C. The drying process may be performed in, e.g., an infrared drying furnace. The drying time may be, for example, about 20 seconds to about 120 seconds, or, for example, about 30 seconds to about 90 seconds.

After the conductive paste is printed onto the substrate, the printed conductive pasted may be baked to form a finger electrode. The baking may be performed at about 700° C. to about 1,000° C., or, for example, at about 800° C. to about 950° C. The baking time may be for about 30 seconds to about 180 seconds, or, for example, for about 40 seconds to about 120 seconds.

The finger electrode for the solar cell prepared according to the above embodiments may have a relatively thin line width. For example, the line width of the finger electrode may be about 100 μm or less, or, for example, about 20 μm to about 80 μm, or, for example, about 40 μm to about 60 μm to broaden the light receiving area. The finger electrode for the solar cell prepared according to the above embodiments may have a thickness of about 10 μm to about 25 μm, or, for example, about 15 μm to about 23 μm to reduce line resistance and series resistance of the finger electrode such that the finger electrode may exhibit excellent conversion efficiency. By way of example, the finger electrode may have a line width of about 1 μm, 2 μm, 3 μm, 4 μm, 5 μm, 6 μm, 7 μm, 8 μm, 9 μm, 10 μm, Hum, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, Slum, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, or 100 μm, and a thickness of about 10 μm, 12 μm, 13 μm, 14 μm, 15 μm, 16 μm, 17 μm, 18 μm, 19 μm, 20 μm, 21 μm, 22 μm, 23 μm, 24 μm, or 25 μm.

In an implementation, the finger electrode for the solar cell may satisfy the following Formula 1:

$$0.4 \leq A \leq 0.6,\qquad \text{[Formula 1]}$$

wherein, A is an aspect ratio, represented by the formula a thickness of a finger electrode/a width of a finger electrode.

Within this range of the aspect ratio, the finger electrode may exhibit low series resistance and high conversion efficiency.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation Example

Detailed description of each component used in the following Preparation Examples is as follows:

(A) Silver Powder: Silver powder AG-4-8 (Dowa Hightech Co., Ltd.)

(B) Glass Frit: Bi—Te—O-based glass frit ABT-1 (Asahi Glass Co., Ltd.)

(C) Organic binder: Ethyl cellulose STD4 (Dow Chemical Company)

(D) Solvent (D1) to (D5): Chemicals each having a vapor pressure and a flash point as shown in the following Table 1 were used.

TABLE 1

| | Chemical name | Vapor pressure (Pa, at 20° C.) | Flash point (° C.) |
|---|---|---|---|
| D1 | Diethylene glycol n-butyl ether acetate | 0.93 | 102 |
| D2 | 2,2,4-trimethyl-1,3-pentanediol monoisobutyrate | 1.3 | 104 |
| D3 | 2-(4-methyl-1-cyclohex-3-enyl) | 1333 | 82 |
| D4 | Ethylene glycol n-butyl ether | 88 | 65 |
| D5 | Poly(oxy-1,2-ethandiyl), α-phenyl-ω-hydroxy | less than 0.01 | more than 149 |

For each of the Preparation Examples 1 to 5, a composition for forming a solar cell electrode was prepared by mixing each component in a ratio as listed in the following Table 2. Specifically, an organic binder (C) was sufficiently dissolved in a solvent (D) at 60° C. to prepare an organic vehicle. A silver power (A), a glass frit (B), a thixotropic agent (E) Thixatrol ST (Elementis Co., Ltd.), and a dispersing agent (F) TEGO® Dispers 656 (Evonik Co., Ltd.) were added to the organic vehicle, followed by mixing and dispersing in a 3-roll miller to prepare a conductive paste.

TABLE 2

| (Unit: wt %) | | Preparation Example 1 | Preparation Example 2 | Preparation Example 3 | Preparation Example 4 | Preparation Example 5 |
|---|---|---|---|---|---|---|
| (A) Silver powder | | 90.9 | 90.9 | 90.9 | 90.9 | 90.9 |
| (B) Glass frit | | 3.1 | 3.1 | 3.1 | 3.1 | 3.1 |
| (C) Organic binder | | 1 | 1 | 1 | 1 | 1 |
| (D) Solvent | (D1) | 4 | — | — | — | — |
| | (D2) | — | 4 | — | — | — |
| | (D3) | — | — | 4 | — | — |
| | (D4) | — | — | — | 4 | — |
| | (D5) | — | — | — | — | 4 |
| (E) Thixotropic agent | | 0.4 | 0.4 | 0.4 | 0.4 | 0.4 |
| (F) Dispersing agent | | 0.6 | 0.6 | 0.6 | 0.6 | 0.6 |

Example 1

A print mask having an aperture ratio of 82% and a line width of an electrode printing portion of 26 μm (Sanli Precision Ind.) was disposed on a front surface of a semiconductor substrate. The conductive paste prepared in Preparation Example 1 was disposed on the print mask, and the conductive paste was printed onto the semiconductor substrate using a squeezer and then dried at 150° C. to 400° C. in an infrared drying furnace. An aluminum paste was printed onto a rear surface of the semiconductor substrate and dried in the same manner as above. The cell prepared by the above procedure was baked at 950° C. for 60 seconds in a belt type baking furnace to prepare a cell for a solar cell.

Example 2

A cell for a solar cell was prepared in the same manner as in Example 1 except that a conductive paste prepared in Preparation Example 2 was used.

Comparative Example 1

A cell for a solar cell was prepared in the same manner as in Example 1 except that a conductive paste prepared in Preparation Example 3 was used.

Comparative Example 2

A cell for a solar cell was prepared in the same manner as in Example 1 except that a conductive paste prepared in Preparation Example 4 was used.

Comparative Example 3

A cell for a solar cell was prepared in the same manner as in Example 1 except that a conductive paste prepared in Preparation Example 5 was used.

Comparative Example 4

A cell for a solar cell was prepared in the same manner as in Example 1 except that a print mask having an aperture ratio of 63% and a line width of an electrode printing portion of 37 μm (Lebon Screen Printing Equipment) was used.

Evaluation of Properties (1) Line width and thickness: For each of the cells prepared in Examples 1 to 2 and Comparative Examples 1 to 4, a line width and a thickness of the finger electrode were measured using a 3-dimensional measuring machine VK analyzer (KEYENCE Corporation), and the results are shown in the following Table 3.

(2) Electrical properties: For each of the cells prepared in Examples 1 to 2 and Comparative Examples 1 to 4, short circuit current (Isc), contact resistance (Rs), and conversion efficiency (Eff.) were measured using a solar cell efficiency measuring machine CT-801 (Pasan SA). The results are shown in the following Table 3.

TABLE 3

| | Line width (μm) | Thickness (μm) | Aspect ratio (thickness/ line width) | Isc (A) | Rs (mΩ) | Eff. (%) |
|---|---|---|---|---|---|---|
| Example 1 | 48.9 | 21.3 | 0.44 | 8.90 | 1.85 | 18.51 |
| Example 2 | 50.1 | 20.8 | 0.42 | 8.89 | 1.79 | 18.52 |
| Comparative example 1 | 62.1 | 16.8 | 0.27 | 8.65 | 2.31 | 17.83 |
| Comparative example 2 | 65.2 | 15.9 | 0.24 | 8.60 | 2.44 | 17.77 |
| Comparative example 3 | 67.3 | 14.8 | 0.22 | 8.54 | 2.51 | 17.52 |
| Comparative example 4 | 58.1 | 17.6 | 0.30 | 8.75 | 1.96 | 18.12 |

Referring to the results shown in the above Table 3, each of the solar cell electrodes of Examples 1 to 2 using a print mask having an aperture ratio within the range of embodiments and an organic vehicle including a solvent having a specific vapor pressure and a flash point within the range of embodiments was shown to have a high aspect ratio and low series resistance and to exhibit high conversion efficiency, compared to the solar cell electrodes of Comparative Examples 1 to 4 using a print mask having an aperture ratio outside the scope of the embodiments or using an organic vehicle including a solvent having a vapor pressure or a flash point outside the scope of the embodiments.

By way of summation and review, FIG. 1 illustrates a print mask generally used for forming an electrode for a solar cell. As shown in FIG. 1, the print mask 10 for forming an electrode for a solar cell is generally formed by applying a photoresist resin 14 onto a mesh 12 aligned in a diagonal direction, followed by selectively removing a portion of the photosensitive resin to print an electrode through a photoresist process, thereby forming an electrode printing portion 16. This kind of general print mask may have an aperture ratio of about 45% to about 60%.

A finger electrode that is formed on the front surface of the solar cell by a general method usually has a narrow line width and a high thickness to increase a light receiving area of sunlight. However, in the use of the general print mask, an aspect ratio (height/width ratio) of the electrode cannot be improved beyond a certain range, and conversion efficiency of the solar cell is not improved as well.

A method of manufacturing a finger electrode using a print mask having a relatively high aperture ratio of 65% or more has been suggested in order to improve the aspect ratio of the electrode. However, if the conductive paste for the general print mask having a relatively low aperture ratio were to be used in a print mask having a high aperture ratio, the surface roughness of the printed electrode could increase to cause high line resistance or printing errors.

Thus, a method of manufacturing an electrode for a solar cell using a print mask having an aperture ratio of 65% or more without deteriorating printability or increasing the surface roughness of the electrode is desirable.

Embodiments provide a method of manufacturing a finger electrode for a solar cell using a print mask having a high aperture ratio of about 65% or more, while minimizing a resistance increase due to an increase of a surface roughness and without deteriorating printability.

Embodiments provide a finger electrode for a solar cell manufactured according to methods described herein such that high conversion efficiency is obtained.

According to embodiments, a print mask having an aperture ratio of about 65% or more and by using a glass frit including tellurium oxides and tungsten oxides in a certain ratio to form a finger electrode having a high aspect ratio.

The finger electrode for a solar cell manufactured according to the embodiments may exhibit a high aspect ratio, good electrical properties and high conversion efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof.

What is claimed is:

1. A method of manufacturing a finger electrode for a solar cell, the method comprising:
   printing a conductive paste on one surface of a substrate using a print mask having an aperture ratio of about 65% or more; and
   baking the printed conductive paste;
   wherein:
   the print mask includes:
      a mesh including weft threads and warp threads;
      a photosensitive resin layer integrated with the mesh; and
      an electrode printing portion from which the photosensitive resin layer is removed, wherein an interval of weft threads of the mesh on upper and lower portions of the electrode printing portion is wider than the interval of weft threads on remaining portions of the mesh, the conductive paste includes a conductive powder, a glass frit, and an organic vehicle, the organic vehicle including a solvent having a vapor pressure of about 0.1 Pa to about 500 Pa at room temperature and a flash point of about 90° C. to about 150° C.

2. The method as claimed in claim 1, wherein the print mask has an aperture ratio of about 65% to about 90%.

3. The method as claimed as claimed in claim 1, wherein the baking is performed at a temperature of about 700° C. to about 1,000° C.

4. The method as claimed in claim 1, wherein the solvent includes at least one selected from dipropylene glycol n-propyl ether, dipropylene glycol n-butyl ether, tripropylene glycol methyl ether, tripropylene glycol n-butyl ether, propylene glycol phenyl ether, dipropylene glycol phenyl ether, diethylene glycol methyl ether, triethylene glycol methyl ether, diethylene glycol ethyl ether, triethylene glycol ethyl ether, diethylene glycol n-butyl ether, triethylene glycol n-butyl ether, diethylene glycol n-butyl ether acetate, 2,2,4-trimethyl-1,3-pentanediol monoisobutyrate, ethylene glycol hexyl ether, diethylene glycol hexyl ether, ethylene glycol phenyl ether, diethylene glycol phenyl ether, trimethylnonanol, and diethylene glycol dibutyl ether.

5. The method as claimed as claimed in claim 1, wherein the conductive paste includes:
   about 60 wt % to about 95 wt % of the conductive particles;
   about 0.5 wt % to about 20 wt % of the glass frit; and
   about 1 wt % to about 30 wt % of the organic vehicle.

6. The method as claimed in claim 5, wherein the conductive paste further includes at least one additive selected from a dispersing agent, a thixotropic agent, a plasticizer, a viscosity stabilizer, an antifoaming agent, a pigment, an ultraviolet stabilizer, an antioxidant, and a coupling agent.

7. The method as claimed in claim 1, wherein the finger electrode satisfies the following Formula 1:

$$0.4 \leq A \leq 0.6 \quad \text{[Formula 1]}$$

wherein, A is an aspect ratio represented by the following formula: thickness of the finger electrode/width of the finger electrode.

\* \* \* \* \*